US011550378B2

(12) United States Patent
DeJong et al.

(10) Patent No.: US 11,550,378 B2
(45) Date of Patent: Jan. 10, 2023

(54) SEALED ENCLOSURE POWER CONTROL SYSTEM

(71) Applicant: BWR Innovations LLC, Fargo, ND (US)

(72) Inventors: Travis J. DeJong, Glyndon, MN (US); Adam C. Jorgenson, West Fargo, ND (US); Thomas S. Wohl, West Fargo, ND (US); Joel A. Jorgenson, Fargo, ND (US)

(73) Assignee: BWR Innovations LLC, Fargo, ND (US)

( * ) Notice: Subject to any disclaimer, the term of this patent is extended or adjusted under 35 U.S.C. 154(b) by 206 days.

(21) Appl. No.: 17/130,652

(22) Filed: Dec. 22, 2020

(65) Prior Publication Data

US 2021/0200289 A1    Jul. 1, 2021

Related U.S. Application Data

(60) Provisional application No. 62/955,382, filed on Dec. 30, 2019.

(51) Int. Cl.
*G06F 1/26* (2006.01)
*H01R 13/703* (2006.01)
(Continued)

(52) U.S. Cl.
CPC .............. *G06F 1/263* (2013.01); *G01K 1/024* (2013.01); *G06F 1/188* (2013.01);
(Continued)

(58) Field of Classification Search
CPC .. G01K 1/024; G01K 2215/00; G06F 1/1635; G06F 1/188; G06F 1/26; G06F 1/263; H01R 13/7031; H05K 5/00; H05K 5/069
See application file for complete search history.

(56) References Cited

U.S. PATENT DOCUMENTS

2003/0110001 A1   6/2003  Chassin
2008/0248672 A1*  10/2008 Yip ................. H01R 27/02
                                                        439/300
(Continued)

FOREIGN PATENT DOCUMENTS

WO        2019077141 A1    4/2019

OTHER PUBLICATIONS

PCT International Search Report and Written Opinion for PCT/US2020/067111; dated Apr. 1, 2021.

*Primary Examiner* — Terrell S Johnson
(74) *Attorney, Agent, or Firm* — Neustel Law Offices

(57) ABSTRACT

A sealed enclosure power control system for controlling power to an electrical component within an enclosure. The sealed enclosure power control system generally includes an electrical component within the sealed enclosure, a first connector on the sealed enclosure adapted to provide a sealed electrical interface to the electrical component. The first connector has at least one first connector conductor element, and the system further includes a battery within the sealed enclosure, and the system also has a second connector, wherein when the first connector and the second connector are connected together, electrical power from the battery is applied to the electrical component, and when the first connector and the second connector are not connected together, the electrical power is not applied to the electrical component.

20 Claims, 4 Drawing Sheets

(51) Int. Cl.
     *H05K 5/06*          (2006.01)
     *H05K 5/00*          (2006.01)
     *G06F 1/18*          (2006.01)
     *G01K 1/024*        (2021.01)
     *G06F 1/16*          (2006.01)

(52) U.S. Cl.
     CPC ........... H01R 13/7031 (2013.01); H05K 5/00 (2013.01); *G01K 2215/00* (2013.01); *G06F 1/1635* (2013.01); *G06F 1/26* (2013.01); *H05K 5/069* (2013.01)

(56) References Cited

U.S. PATENT DOCUMENTS

| | | | | |
|---|---|---|---|---|
| 2013/0344818 | A1* | 12/2013 | McGuire | G01D 21/00 361/728 |
| 2017/0358895 | A1* | 12/2017 | Chung | H01R 13/6273 |
| 2018/0293864 | A1* | 10/2018 | Wedig | G08B 21/182 |
| 2020/0323518 | A1* | 10/2020 | Hoffman | G16H 40/63 |

\* cited by examiner

SEALED ENCLOSURE POWER CONTROL SYSTEM

CROSS REFERENCE TO RELATED APPLICATIONS

I hereby claim benefit under Title 35, United States Code, Section 119(e) of U.S. provisional patent application Ser. No. 62/955,382 filed Dec. 30, 2019. The 62/955,382 application is hereby incorporated by reference into this application.

STATEMENT REGARDING FEDERALLY SPONSORED RESEARCH OR DEVELOPMENT

Not applicable to this application.

BACKGROUND

Field

Example embodiments in general relate to a sealed enclosure power control system that allows for different properties to be sensed, with an environmentally sealed and configurable unit.

Related Art

Any discussion of the related art throughout the specification should in no way be considered as an admission that such related art is widely known or forms part of common general knowledge in the field.

Wireless sensors within sealed enclosures are used throughout commercial, industrial, medical, and military applications. In current designs, a different sensor (and enclosure) needs to be used in the event a new sensing function is to be monitored. For example, in existing wireless designs, a battery powered temperature sensor cannot be easily reconfigured to be a vehicle powered humidity sensor without major modification. To monitor a new parameter, a different wireless sensor in its own sealed enclosure must be implemented.

In many applications, having the electronics of the wireless sensor encased in a sealed enclosure is desired. Having a sealed case prohibits dust, debris, moisture, or other contaminants from contacting sensitive circuits, components, or connectors that may compromise the reliability or longevity of the sensor.

However, completely sealing the electronics can present problems. Not being able to access the electronics hinders the ability to change the functionality of the system or the wireless sensor. If the system is completely sealed, then simple features (such as an on/off switch) are complicated, as the switch must be completely sealed through its full range of motion and across all extremes of environmental conditions. An ideal scenario allows ease of functionality change and to turn on/turn off the device without compromising the hermetic seal of the enclosure.

SUMMARY

An example embodiment is directed to a sealed enclosure power control system. The sealed enclosure power control system includes an electrical component within a sealed enclosure, a first connector on the sealed enclosure adapted to provide a sealed electrical interface to the electrical component, the first connector comprising at least one first connector conductor element, and a battery within the sealed enclosure, the battery being electrically coupled to the at least one first connector conductor element.

The system also comprises a second connector, the second connector adapted to be removably connected to the first connector, the second connector comprising at least one second connector conductor element corresponding to the at least one first connector conductor element, wherein when the first connector and the second connector are connected together, an electrical power from the battery is applied to the electrical component and wherein when the first connector and the second connector are not connected together, the electrical power is not applied to the electrical component.

In some example embodiments, the electrical power is applied from the battery to a first conductor element of the first connector, and is further routed through a first conductor element of the second connector to a second conductor element of the second connector such that the electrical power is applied to a corresponding second conductor element of the first connector. However, the electrical power may be applied or routed through other means. As just one possible example, a conductor element of the first connector may have two separate leads, such that when a pin-type conductor element of the second connector is inserted, the two leads of the conductor element of the first connector are connected together. This type of conductor element may be similar to a multi-element component like those used where multiple electrical connections are made using a single pin or plug with multiple conductors (e.g., ring and tip). In such embodiments, the first connector comprises a means for applying the electrical power from the battery to the electrical component when the first connector and the second connector are connected together.

In some example embodiments, the first connector comprises a plurality of conductor elements, and the second connector comprises a plurality of conductor elements that typically correspond to the elements of the first connector. It is possible for at least one of the plurality of conductor elements of the first connector to be usable to identify a type of sensor that provides a signal to the electrical component via the second connector and the first connector. It is also possible for multiple conductor elements to identify the type of sensor that is used, such that many sensor types can be used with the system without modification to any circuitry or component within the sealed enclosure. Further, at least one of the plurality of conductor elements of the first connector can receive a signal from a sensor that is connected to the second connector, and the signal may be provided to the electrical component.

The electrical component within the sealed enclosure may comprise a microprocessor and a non-transitory computer readable recordable medium containing one or more programs executable by the microprocessor which when executed implement the steps of: 1) receiving the identification of the type of sensor that is coupled to the second connector; 2) receiving a signal from a sensor that is coupled to the second connector; and 3) transmitting the sensor type and a data value that represents the signal to an external receiver. Further, in such an example system, the one or more programs when executed may further implement the step of determining the data value from the signal from the sensor based on the sensor type. The electrical power can be provided to the microprocessor and the non-transitory computer readable recordable medium when the first connector and the second connector are connected together.

A method of using the power control system may also be performed, comprising the steps of: 1) providing the electrical power to the electrical component by connecting the first connector to the second connector; 2) providing a signal from a sensor having a sensor type to the first connector via the second connector; 3) generating, in the electrical component, a data value corresponding to the signal; and 4) transmitting the data value to an external receiver. In carrying out the foregoing method, generating the data value may comprise using a sensor type determined by an address value on at least one second connector conductor element, or on a plurality of conductor elements.

The sensor may be coupled to the second connector such that the signal from the sensor is provided to the first connector from the second connector when the first connector and the second connector are connected together. In carrying out the method, the electrical power can be applied from the battery to a first conductor element of the first connector, and is further routed through a first conductor element of the second connector to a second conductor element of the second connector, such that the electrical power is applied to a corresponding second conductor element of the first connector.

There has thus been outlined, rather broadly, some of the embodiments of the sealed enclosure power control system in order that the detailed description thereof may be better understood, and in order that the present contribution to the art may be better appreciated. There are additional embodiments of the sealed enclosure power control system that will be described hereinafter and that will form the subject matter of the claims appended hereto. In this respect, before explaining at least one embodiment of the sealed enclosure power control system in detail, it is to be understood that the sealed enclosure power control system is not limited in its application to the details of construction or to the arrangements of the components set forth in the following description or illustrated in the drawings. The sealed enclosure power control system is capable of other embodiments and of being practiced and carried out in various ways. Also, it is to be understood that the phraseology and terminology employed herein are for the purpose of the description and should not be regarded as limiting.

BRIEF DESCRIPTION OF THE DRAWINGS

Example embodiments will become more fully understood from the detailed description given herein below and the accompanying drawings, wherein like elements are represented by like reference characters, which are given by way of illustration only and thus are not limitative of the example embodiments herein.

A. OVERVIEW

An example sealed enclosure power control system 100 generally includes an electrical component 140 within a sealed enclosure 101, a first connector 110 on the sealed enclosure 101 adapted to provide a sealed electrical interface to the electrical component 140 within the enclosure 101.

Figure 1:
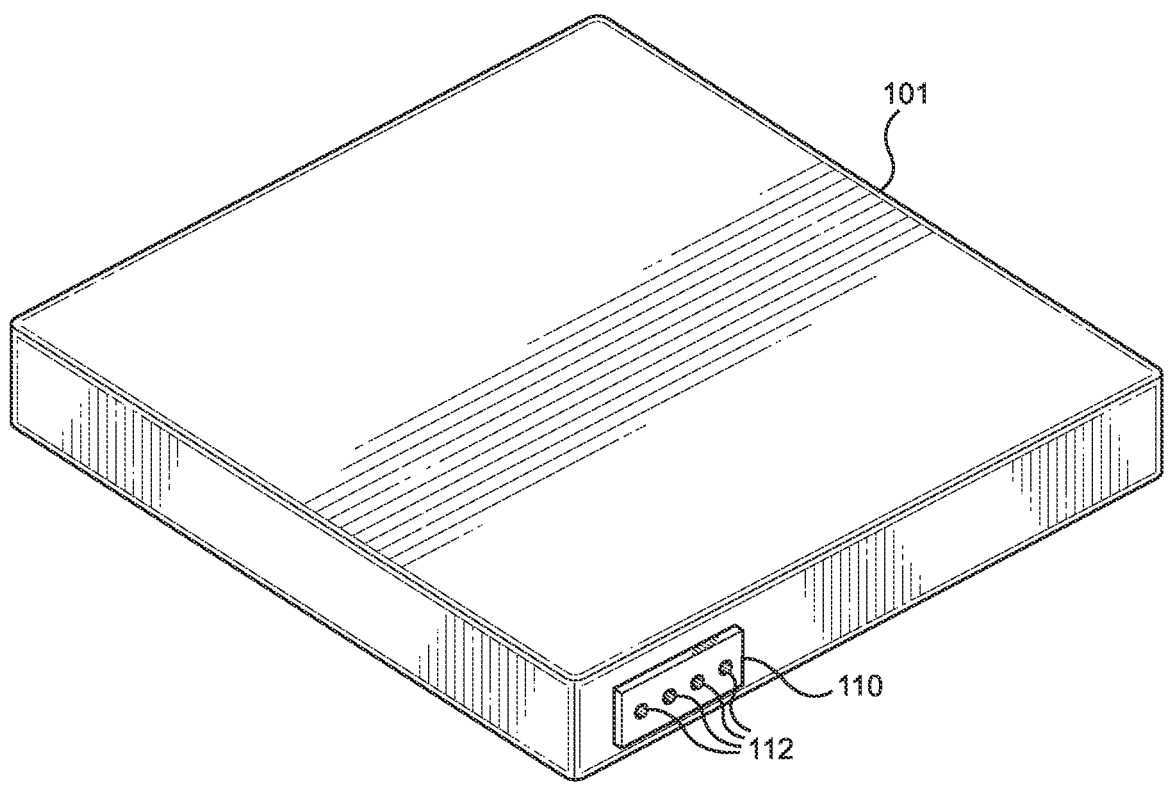
FIG. 1 is a perspective view of a sealed enclosure in accordance with an example embodiment of a sealed enclosure power control system.

The first connector 110 will typically have at least one first connector conductor element 112, and may have multiple conductor elements, the function of which will be described in detail herein. The first connector 110 is attached to the sealed enclosure 101 so that the first connector conductor element(s) 112 are externally exposed from the sealed enclosure 101 as shown in FIG. 1 of the drawings. The system also includes a battery 150 within the sealed enclosure 101, the battery 150 being electrically coupled to the at least one first connector conductor element 112.

The system may also include a second connector 120, the second connector 120 adapted to be removably connected to the first connector 110, and like the first connector 110, the second connector 120 will typically include at least one second connector conductor element 122, and usually will include a plurality of conductor elements 122. The conductor elements 112 and 122 may either be male or female types (e.g., pins or sockets), interchangeably. In addition, each or any conductor element 112, 122 may have or comprise multiple connections. For example, as with a multi-conductor audio plug, a female socket on first connector 110 may have multiple, electrically isolated contact points, such that a circuit or connection between the two points is completed when a pin from second connector 120 is mated with it.

Each conductor element 122 of the second connector corresponds to a similar, mating element 112 of the first connector 110, such that when the first connector 110 and the second connector 120 are connected together, each corresponding conductor is conductively coupled to a corresponding conductor in its mating connector. Further, electrical power from the battery 150 is in some example embodiments, applied to the electrical component 140 when the first connector 110 and the second connector 120 are connected together, and the electrical power is removed when the first connector 110 and the second connector 120 are not connected together. In such cases, the conductive path may be completed by a connection between two conductor elements 122 on the second connector 120, or otherwise within a sensor assembly 130—the only requirement being that one element is connected electrically to another when the two connectors 110, 120 are connected together.

The electrical power in such an embodiment can be applied from the battery to a first conductor element 112 of the first connector 110, and is further routed through a corresponding first conductor element 122 of the second connector 120 to a second conductor element 122 of the second connector such that the electrical power is applied to a corresponding second conductor element of the first connector. In simplified terms, there may be a particular conductor element on the first connector 110 that has no power when the second connector 120 is not connected to the first connector 120. Then, when the second connector 120 is connected to the first connector 110, power is routed through a connection between conductor elements on the second connector 120 to apply power to the particular conductor element. The electrical power is thus provided to electrical component 140, and any other associated, optional, or desired circuitry or components within the sealed enclosure 101.

Notably, the electrical power may also be applied or routed to electrical component 140 through other means. As just one possible example, a conductor element 112 of the first connector 110 may have two separate leads, such that when a pin-type conductor element 122 of the second connector 120 is inserted, the two leads of the conductor element 112 of the first connector 110 are connected together. This type of conductor element may be similar to a multi-element component like those used where multiple electrical connections are made using a single pin or plug with multiple conductors (e.g., "ring and tip"). In such embodiments, the first connector 110 comprises a means for applying the electrical power from the battery 150 to the electrical component 140 when the first connector 110 and the second connector 120 are connected together.

In some example embodiments, the first connector 110 comprises a plurality of conductor elements 112, and the second connector 120 also comprises a plurality of conductor elements 122 that typically correspond to the elements of the first connector 110, as described above. It is possible for at least one of the plurality of conductor elements of the first connector 110 to be usable to identify a type of sensor 132 that provides a signal to the electrical component 140 via the second connector 120 and the first connector 110. It is also possible for multiple conductor elements 112 to carry signals used to identify or signify the type of sensor 132 that is used or connected to the sealed enclosure 101, such that many different sensor types can be used with the system 100 without modification to any circuitry or component within the sealed enclosure 101. Further, at least one of the plurality of conductor elements 112 of the first connector 110 can receive a signal from a sensor 132 that is connected to the second connector 120, and the signal may be provided to the electrical component 140. The sensor 132 may be a simple sensor, such as a thermocouple, or it may be any other type, such as a more complex transducer that requires a power input, which may be provided from the electrical component 140 through an electrical interface, such as the interface from the first connector to the second connector.

The electrical component 140 within the sealed enclosure 101 may comprise a microprocessor 141 and a non-transitory computer readable recordable medium 143 containing one or more programs executable by the microprocessor 141 which when executed implement the steps of: 1) receiving the identification of the type of sensor that is coupled to the second connector; 2) receiving a signal from a sensor that is coupled to the second connector; and 3) transmitting the sensor type and a data value that represents the signal to an external receiver 160, via receiving antenna 162. Further, in such an example system, the one or more programs when executed may further implement the step of determining the data value from the signal from the sensor 132 based on the sensor type. The electrical power can be provided to the microprocessor 141 and the non-transitory computer readable recordable medium 143 when the first connector 110 and the second connector 120 are connected together.

The microprocessor 141 may provide data and/or signals to antenna 145 such that a communication link 147 may carry data representative of a value from the sensor 132 to an external receiver 160. The format of such a signal may be any typical format, such as WiFi, Bluetooth, or any proprietary or usable communications format.

B. SEALED ENCLOSURE

Figure 4:
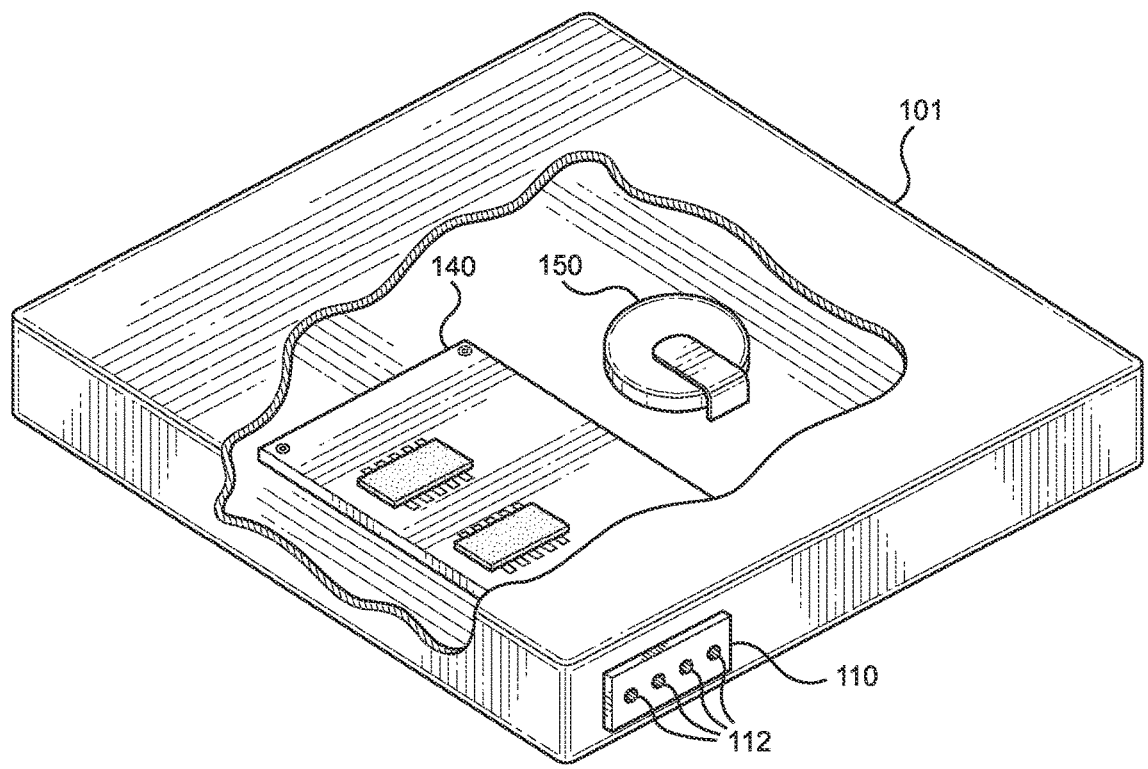
FIG. 4 is a cutaway view of a sealed enclosure in accordance with an example embodiment.
Figure 5:
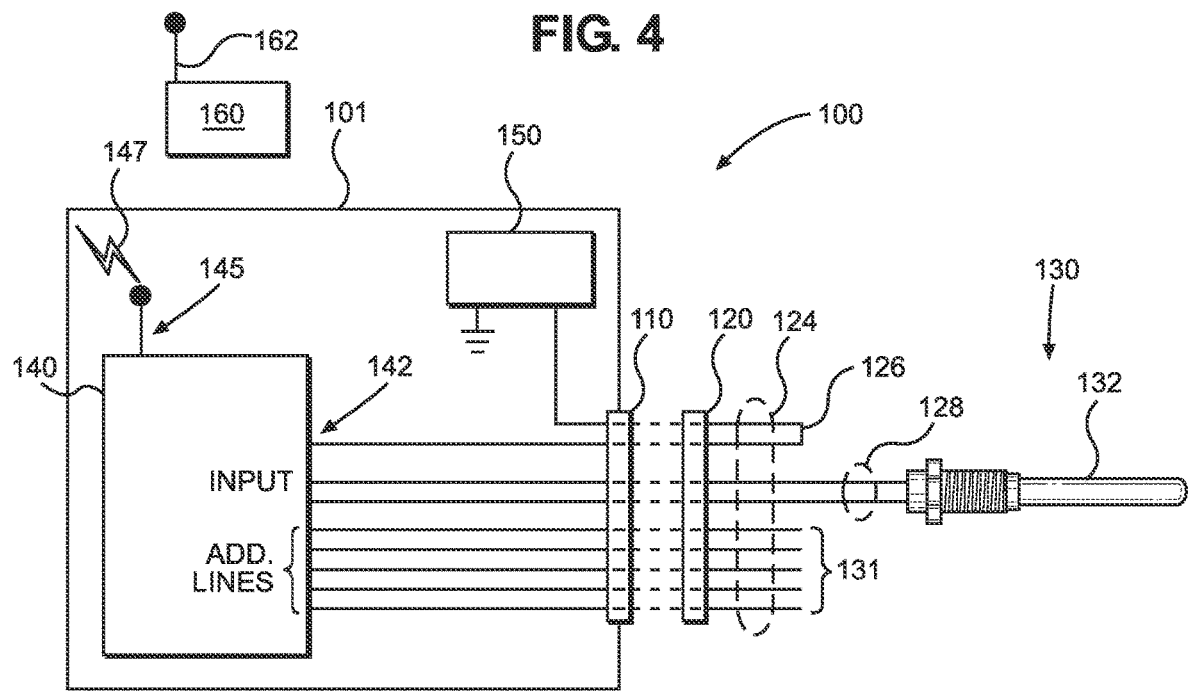
FIG. 5 is a block diagram of a sealed enclosure power control system in accordance with an example embodiment.

In many applications, having the electronics of a wireless sensor system encased in a sealed enclosure, such as enclosure 101, is desired. Such an enclosure 101 is shown, for example, in FIGS. 1, 3, and 4, as well as depicted in block form in FIGS. 5 and 6. In this case, a wireless sensor system simply refers to a sensor system that is not necessarily connected to the ultimate destination of a transducer or sensor signal by a wire. For example, as shown in FIG. 5, the enclosure 101 is remote from, and not connected by wire, to a remote, external receiver 160. The sealed enclosure 101 may have various shapes and dimensions along with one or more interior spaces.

Wireless sensors are used throughout commercial, industrial, medical, and military applications. In current designs, entirely separate sensor systems are needed whenever a new environmental parameter is to be monitored. For example, in some existing wireless designs, a battery powered temperature sensor system cannot be easily reconfigured to be a vehicle-powered humidity sensor system without major modification. Thus, having a sealed case prohibits dust, debris, moisture, or other contaminants from contacting sensitive circuits, components, or connectors that may compromise the reliability or longevity of the sensor system, but may make changing configurations difficult.

The sealed enclosure 101, by itself, eliminates the environmental problems noted above. As shown, it is hermetically sealed, and its only interface is a sealed connector, such as first connector 110. Thus, when a mating connector is installed on first connector 110, the entire package is sealed and impervious to dust, debris, moisture, etc. The most sensitive parts of the system 100 are enclosed within the sealed interior space of the sealed enclosure 101. These include a battery 150 or other power source, and an electrical component 140, which may further include a microprocessor 141, a memory 143, and any other active or passive components or circuits needed or desired to make the system 100 work. The battery 150, or any other power source, as described below, may typically provide electrical power selectively to the electrical component 140 at power input 142 of the component, as shown for example in FIGS. 5 and 6.

As just one example, electrical component 140 may be or comprise a printed circuit board with the above-mentioned components on it. Further, the electrical component 140 may be functionally and structurally connected to the inside part of first connector 110. For example, as is well-known, the portion of first connector 110 inside sealed enclosure 101 may have conductor elements that are directly soldered or otherwise connected to the printed circuit board, providing the electrical connections shown, for example, in FIGS. 5 and 6.

The first connector 110 may have a specific connector pin assignment that allows the system 100 to be easily reconfigured. For example, the following are possible pin assignments: Battery connection, where the positive terminal of the battery or batteries is connected. This connection may be supplied to a powered transducer or sensor, and may also be looped back through the second connector 120 to another pin on the first connector 110, such that when the two connectors are mated, power is selectively applied to a pin or conductor element 112 of the first connector 110; Power supply, where the power supply to the active and passive components of the electrical component or any circuitry within the sealed enclosure 101 is connected; Negative battery connection, which may also be the negative terminal of the battery and also the negative connection of the electrical component 140, and any active and passive components of the system; Address pins, used to provide a definition of the sensor or transducer connected on the second connector 120; Serial communication, for a serial protocol for sophisticated external transducers; and Analog connections, for connection of simple sensors or transducers. Exemplary connections and pin assignments are shown, for example, in FIGS. 5-6. Note that the connection from sensor 132 may be serial or analog.

C. SENSOR ASSEMBLY

Figure 2:
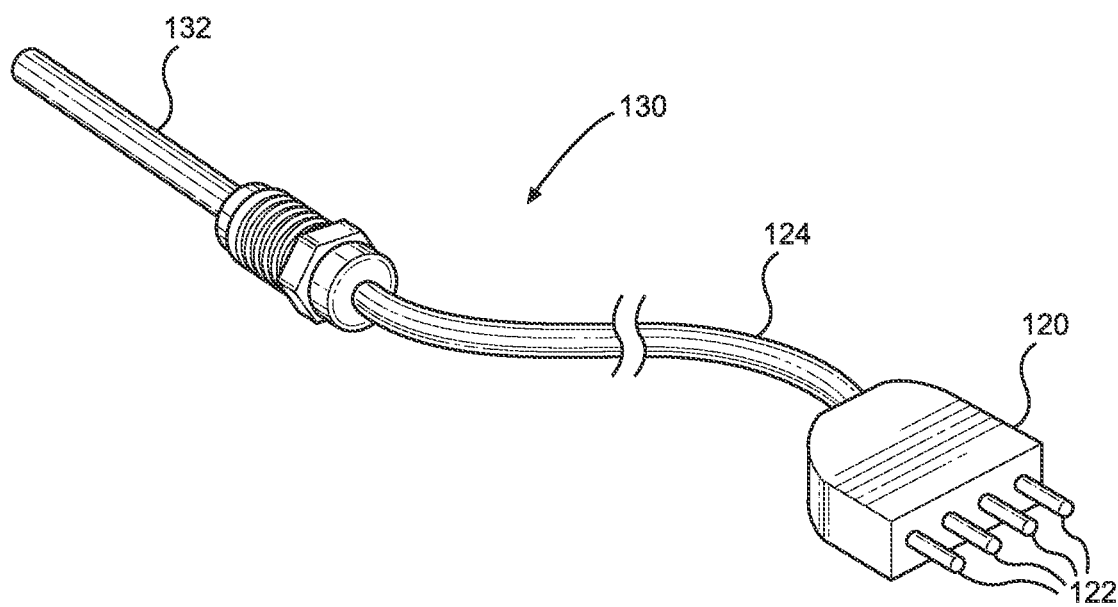
FIG. 2 is a sensor assembly usable with a sealed enclosure power control system in accordance with an example embodiment.
Figure 3:
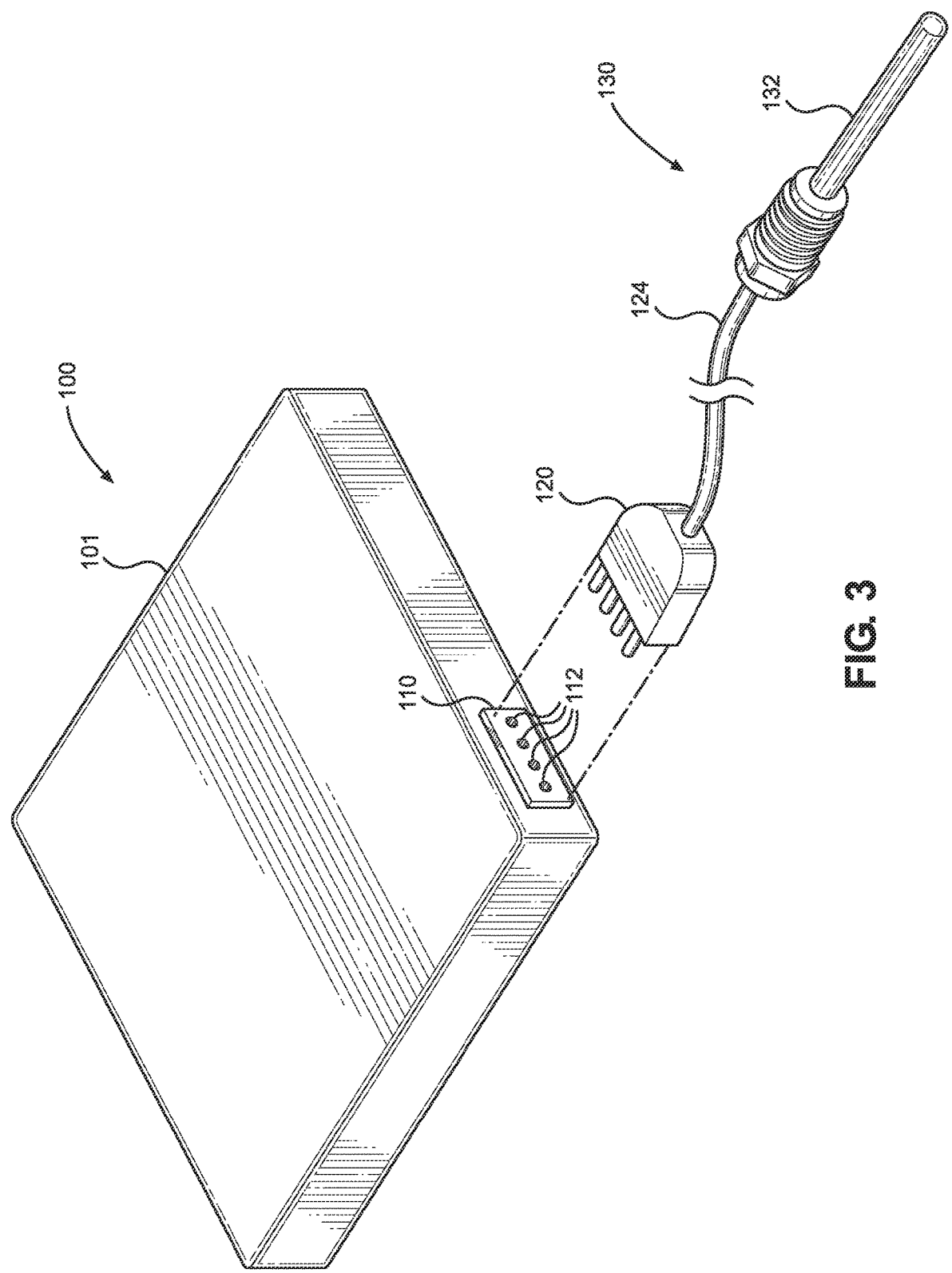
FIG. 3 is a partially exploded view of a sealed enclosure power control system in accordance with an example embodiment.
Figure 6:
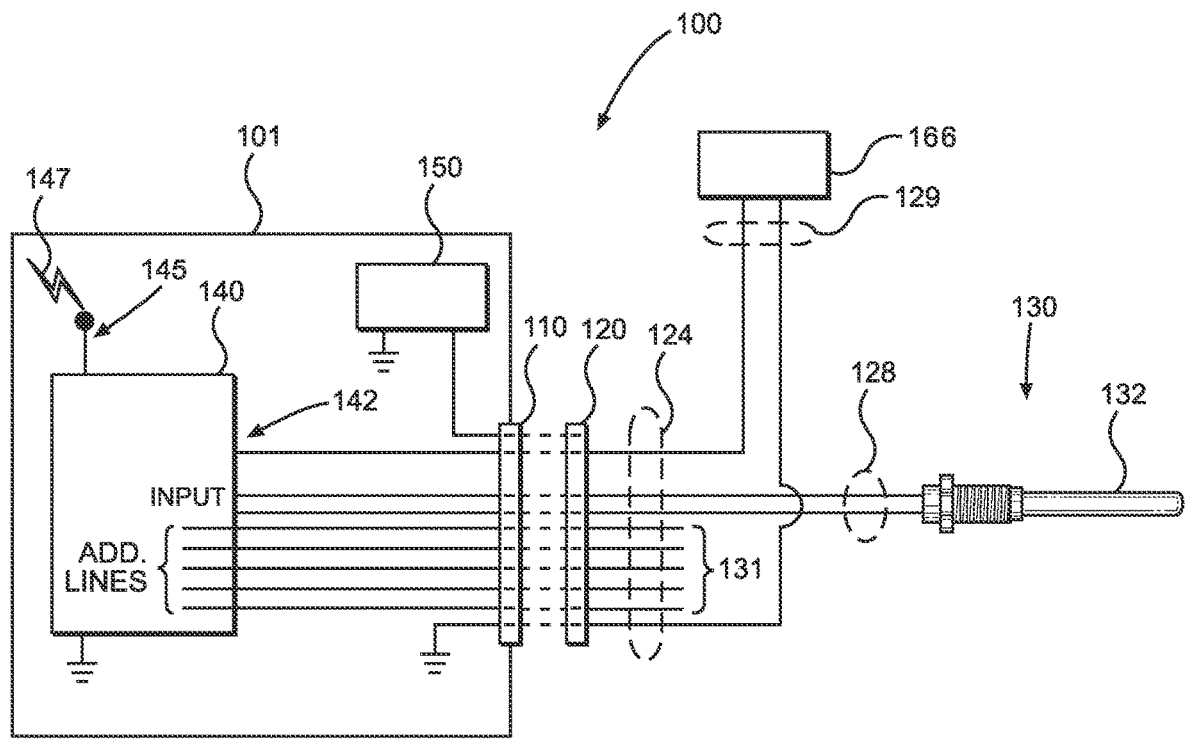
FIG. 6 is a block diagram of a sealed enclosure power control system in accordance with an alternative example embodiment.

As best shown in FIGS. 2-3, and schematically in FIGS. 5 and 6, the system 100 may include or use a sensor assembly 130, which may typically comprise a transducer or sensor 132, connector 120, and a tether or cable 124 that may mechanically and electrically couple or connect the transducer or sensor to the second connector 120. As an alternative, the sensor assembly may not have or need an elongated cable such as cable 124, and may instead use a sensor 132 that is contained in or part of second connector 120, the sensor 132 in such case possibly having an exposed portion. To extend the reach of sensor 132, it is not necessary for all connections within or to the second connector 120 to be made near the sensor 132. In such cases, the sensor 132 may include a smaller sensor cable 128 is indicated in FIGS. 5 and 6.

For example, in some applications it may be acceptable to sense temperature, humidity, pressure, etc. with a small portion of sensor 132 exposed beyond the housing of second connector 120. If so, the cable or tether can be eliminated, and the system can operate satisfactorily with just a compact, self-contained second connector, which, as discussed herein, functions as an on/off switch and to signal or inform the electrical component 140 within the sealed enclosure 101 regarding the type of sensor 132 that is plugged in and being used to provide a signal or data to the electrical component 140.

As also discussed previously, the both the first connector 110 and the second connector 120 can be sealing or sealed connectors, such that when they are mated together, the entire system 100 is sealed and impervious to the elements and environmental conditions. As shown in FIGS. 5 and 6, the second connector 120 may have wiring connections within it, such as power connection 126, which serves to provide power from one pin or conductor element 112 of the first connector to another pin or conductor element 112 of the first connector, but only when the two connectors are connected together. As shown in FIG. 5, the connection from the positive output of the battery 150 is connected to a conductor element 112 of the first connector, but not to any other element or component. However, this is not critical, as the battery 150, or other power source within sealed enclosure 101, may be connected to any element or component as necessary, such as to provide a low level of power, while maintaining the functionality shown, wherein the battery 150 only provide primary (or high-level) power through second connector 120.

Various types of sensors 132 can be used with the system, with their function and characteristics being indicatable by address lines 131. The address lines 131 may be hard-wired within second connector 120, with voltage levels on any number of conductor elements being used as addresses that indicate the connector type that is mated or coupled to the second connector 120. As a specific example, a low voltage (i.e., logic low) may be applied to a number of conductor elements 122 of the second connector 120 through a negative connection from the battery 150 or circuitry within the sealed enclosure 101.

In addition to providing power to electrical component 140 from battery 150, the second connector 120 may be connected to an external power source 166, as shown for example in FIG. 6. The external power source 166 could be connected to the cable, tether, or otherwise to the second connector 120 to supply power to any component or components within sealed enclosure 101, such as electrical component 140, in lieu of or in addition to the battery 150 within the enclosure. The external power source 166 may be connected to the second connector 120 via its own cable 129. By way of non-limiting example, such external power sources 166 could include a grid power connection, an external battery power connection, an external vehicle power connection, an external solar power connection, an external wind power connection, or any other external power connection. To implement this, the desired external power connection will be physically wired to the power supply connection on the tether with the corresponding battery power connection. Therefore, when the cable 124 or second connector 120 is connected to the first connector 110, the power supply of the sealed enclosure is physically connected to the external power supply, with both positive and negative connections being available, as shown. Also, as with the case when the internal battery 150 is used, any of the positive or negative leads may be wired to the address lines to provide an address that corresponds to the type of sensor 132, or any other parameters of the system or the sensor assembly 130, and even the type of power supply.

D. MICROPROCESSOR

The system—specifically, the electrical component 140, may utilize either analog and digital circuitry, or may use a microprocessor 141, a memory bus, a memory 143, which may be volatile or nonvolatile, random access memory (RAM), read only memory (ROM), or the like, and a peripheral bus to process and transmit signals, data values, etc. Even if a microprocessor 141 is used, the electrical component may include additional analog and digital circuitry, as may be needed to read address lines, logic conditions, supply power to, and receive analog signals from the sensor 132, or a transducer, etc. The microprocessor may be a general-purpose digital processor that controls the operation of the electrical component. The microprocessor can be a single-chip processor or it may be implemented with multiple components. Using instructions retrieved from memory 143, the microprocessor 141 essentially becomes a special-purpose microprocessor that controls the reception and manipulations of input data and the output and transmission of data on output devices, such as a WiFi transmitter and an antenna 147. The memory bus is utilized by the microprocessor 141 to access any memory devices 143, such as RAM and ROM. RAM is used by microprocessor 141 as a general storage area and as scratch-pad memory, and can also be used to store input data and processed data.

Figure 7:
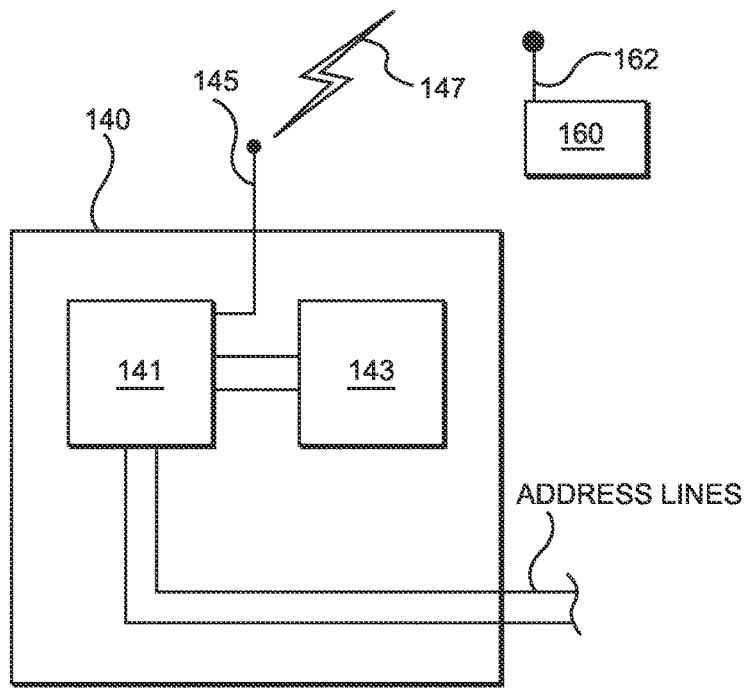
FIG. 7 is a block diagram of an electrical component that would typically be within a sealed enclosure power control system in accordance with an example embodiment.

ROM can be used to store instructions or program code followed by microprocessor 141 as well as other data. A peripheral bus is used to access the input, output and storage devices used by the computer. The microprocessor can be used as shown in FIG. 7, to ultimately communicate (e.g., directly or indirectly, through peripherals) with an external receiver 160 via communication link 147, transmitted between antennas 145 and 162, so that the data provided by sensor 132 and, if applicable, data from or representative of data from address lines 131 indicating what type of sensor and thus what type of parameter is being reported from the system 100. The data path of the address lines to microprocessor 141 and ultimately external receiver 160 is shown in FIG. 7.

The microprocessor 141 together with an operating system and memory operate to execute computer code and produce and use data. The computer code and data may reside on RAM, ROM, or a hard disk drive. An interface card or similar device or circuitry and appropriate software implemented by the microprocessor 141 can be utilized to connect the system 100 to an existing network and transfer data according to standard protocols. A network as used and referenced herein may comprise the system and an external receiver, or may be more extensive, including multiple enclosures and receivers.

E. OPERATION OF PREFERRED EMBODIMENT

In use, various types of sensors 132 can be used with the system, as noted above, with their function and characteristics being indicatable or dictated by address lines 131. The address lines 131 may be hard-wired within the second connector 120, with voltage levels on any number of conductor elements being used as addresses that indicate the sensor type that is mated or coupled to the second connector 120. As a specific example, a low voltage (i.e., logic low) may be applied to a number of conductor elements 122 of the second connector 120 through a negative connection from the battery 150 or circuitry within the sealed As is known, the address provided by second connector 120 may be in binary or BCD format, or any other usable format capable of uniquely identifying multiple parameters associated with sensor assembly 130, sensor 132, etc. This scheme allows a circuit or component, such as microprocessor 141, to use data or program information associated with the correct sensor type as indicated by the address. For example, if a thermocouple is plugged into the sealed enclosure 101, the address will indicate that, in addition to what type of thermocouple is connected (e.g., type K, T, etc.) and the microprocessor 141 or electrical component 140 can process the thermocouple voltage according to standard values to calculate the temperature read by sensor 132. For example, in one possible connection configuration (for example, all of the address pins connected to ground), this connection may correspond to the transducer or sensor being a thermistor. Upon power up, the electrical component 140 within the sealed enclosure 101 will determine the connections on the address pins to all be grounded, recognize this configuration to be a temperature function, and broadcast the data as temperature. In a different configuration, where one of the address pins (perhaps the least significant digit as defined in the pin connections) is connected to the power supply pin while the remaining address pins are connected to ground, the electrical component 140 will recognize the connection pattern as corresponding to a relative humidity sensor and broadcast the data as relative humidity.

Accordingly, use of the system 100 allows a user to only change the least costly component, in this case, the sensor assembly 130 connecting to the sealed enclosure 101. The system can thus perform a wide range of functions, from a grid powered temperature sensor to a battery-powered humidity sensor, with no changes to the electronics or sealed enclosure 101, by only changing the external sensor assembly or even an integrated sensor/connector as described above, which is the easiest and least expensive component to change.

The transducer 132 on the cable 124 may be analog in its function (with a variable voltage, resistance, conductance, or current) or digital (with a one wire or multi wire communication protocol). Environmental parameters that may be measured include, but are not limited to:

Temperature
Relative humidity
Air pressure
Contact pressure
Elapsed time
Position
Magnetic
Vibration
Gas concentrations, such as CO or $CO_2$
Turbidity
Wind
Altitude
Moisture
Liquid level The system 100 will read the address pin connections, read the data of the transducer, and broadcast a data package wirelessly via a communications link 147 that contains the transducer or sensor type and address. Any receiver that connects to the system 100 can decode the address pins based on the connection, and translate the corresponding transducer data to a meaningful value.

The sensor data from sensor 132 may be processed entirely by electrical component 140, and then be transmitted to an external receiver 160 via communication link 147, using antennas 145 and 162 as shown in FIGS. 5-7. Alternatively, the raw sensor data along with address information signifying the sensor/parameter type may be sent as just described for processing by receiver 160 or other parts of a system.

Unless otherwise defined, all technical and scientific terms used herein have the same meaning as commonly understood by one of ordinary skill in the art to which this invention belongs. Although methods and materials similar to or equivalent to those described herein can be used in the practice or testing of the sealed enclosure power control system, suitable methods and materials are described above. All patent applications, patents, and printed publications cited herein are incorporated herein by reference in their entireties, except for any definitions, subject matter disclaimers or disavowals, and except to the extent that the incorporated material is inconsistent with the express disclosure herein, in which case the language in this disclosure controls. The sealed enclosure power control system may be embodied in other specific forms without departing from the spirit or essential attributes thereof, and it is therefore desired that the present embodiment be considered in all respects as illustrative and not restrictive. Any headings utilized within the description are for convenience only and have no legal or limiting effect.

What is claimed is:

1. A sealed enclosure power control system, comprising:
a sealed enclosure;
an electrical component within an interior space of the sealed enclosure;
a first connector on the sealed enclosure adapted to provide a sealed electrical interface to the electrical component, the first connector comprising at least one first connector conductor element;

a battery within the interior space of the sealed enclosure, the battery being electrically coupled to the at least one first connector conductor element; and a second connector, the second connector adapted to be removably connected to the first connector, the second connector comprising at least one second connector conductor element corresponding to the at least one first connector conductor element;

wherein when the first connector and the second connector are connected together, an electrical power from the battery is applied to the electrical component; and wherein when the first connector and the second connector are not connected together, the electrical power is not applied to the electrical component.

2. The sealed enclosure power control system of claim 1, wherein the electrical power is applied from the battery to a first conductor element of the first connector, and is further routed through a first conductor element of the second connector to a second conductor element of the second connector such that the electrical power is applied to a corresponding second conductor element of the first connector.

3. The sealed enclosure power control system of claim 1, wherein the first connector comprises a plurality of conductor elements, and wherein the second connector comprises a plurality of conductor elements.

4. The sealed enclosure power control system of claim 1, wherein the first connector comprises a means for applying the electrical power from the battery to the electrical component when the first connector and the second connector are connected together.

5. The sealed enclosure power control system of claim 1, wherein the first connector comprises a plurality of conductor elements, and wherein the second connector comprises a plurality of conductor elements, and wherein at least one of the plurality of conductor elements of the first connector is used to identify a type of sensor that provides a signal to the electrical component via the second connector and the first connector.

6. The sealed enclosure power control system of claim 1, wherein the first connector comprises a plurality of conductor elements, and wherein the second connector comprises a plurality of conductor elements, and wherein at least one of the plurality of conductor elements of the first connector receives a signal from a sensor that is connected to the second connector.

7. The sealed enclosure power control system of claim 6, wherein at least one of the plurality of conductor elements of the second connector is used to provide to the electrical component via the first connector, an identification of a type of sensor that is coupled to the second connector.

8. The sealed enclosure power control system of claim 7, wherein the electrical component comprises a microprocessor and a non-transitory computer readable recordable medium containing one or more programs executable by the microprocessor which when executed implement the steps of:

receiving the identification of the type of sensor that is coupled to the second connector;

receiving a signal from a sensor that is coupled to the second connector; and transmitting the sensor type and a data value that represents the signal to an external receiver.

9. The sealed enclosure power control system of claim 8, wherein the one or more programs when executed further implements the step of determining the data value from the signal based on the sensor type.

10. The sealed enclosure power control system of claim 8, wherein the electrical power is provided to the microprocessor and the non-transitory computer readable recordable medium when the first connector and the second connector are connected together.

11. A method of using the sealed enclosure power control system of claim 1, comprising the steps of:

providing the electrical power to the electrical component by connecting the first connector to the second connector;

providing a signal from a sensor having a sensor type to the first connector via the second connector;

generating, in the electrical component, a data value corresponding to the signal; and transmitting the data value to an external receiver.

12. The method of claim 11, wherein generating the data value comprises using a sensor type determined by an address value on at least one second connector conductor element.

13. The method of claim 11, wherein the first connector comprises a plurality of first connector conductor elements, and wherein the second connector comprises a plurality of second connector conductor elements, and wherein the sensor type is indicated by an address value on a plurality of the second connector conductor elements.

14. The method of claim 11, wherein a sensor is coupled to the second connector such that the signal from the sensor is provided to the first connector from the second connector when the first connector and the second connector are connected together.

15. The method of claim 11, wherein the electrical power is applied from the battery to a first conductor element of the first connector, and is further routed through a first conductor element of the second connector to a second conductor element of the second connector, such that the electrical power is applied to a corresponding second conductor element of the first connector.

16. The method of claim 11, wherein the first connector comprises a means for applying the electrical power from the battery to the electrical component when the first connector and the second connector are connected together.

17. A sealed enclosure power control system, comprising:
a sealed enclosure;
an electrical component within an interior space of the sealed enclosure;
a first connector on the sealed enclosure adapted to provide a sealed electrical interface to the electrical component, the first connector comprising a plurality of conductor elements;
a battery within the interior space of the sealed enclosure, the battery being electrically coupled to a first conductor element of the first connector; and
a second connector, the second connector adapted to be removably connected to the first connector, the second connector comprising a plurality of conductor elements corresponding to the plurality of conductor elements of the first connector;
wherein when the first connector and the second connector are connected together, an electrical power is applied from the battery to the first conductor element of the first connector, and is further routed through a first conductor element of the second connector to a second conductor element of the second connector such that the electrical power is applied to a corresponding second conductor element of the first connector and is also applied to the electrical component;

wherein when the first connector and the second connector are not connected together, the electrical power is not applied to the electrical component; and wherein at least one of the plurality of conductor elements of the first connector is used to identify a type of sensor that provides a signal to the electrical component via the second connector and the first connector.

18. The sealed enclosure power control system of claim 17, wherein the electrical component comprises a microprocessor and a non-transitory computer readable recordable medium containing one or more programs executable by the microprocessor which when executed implement the steps of:

receiving an identification of the type of sensor that is coupled to the second connector;

receiving a signal from a sensor that is coupled to the second connector; and transmitting the sensor type and a data value that represents the signal to an external receiver.

19. The sealed enclosure power control system of claim 18, wherein the one or more programs when executed further implements the step of determining the data value from the signal based on the sensor type.

20. A sealed enclosure power control system, comprising:

a sealed enclosure;

an electrical component within an interior space of the sealed enclosure;

a first connector on the sealed enclosure adapted to provide a sealed electrical interface to the electrical component, the first connector comprising a plurality of conductor elements;

a battery within the interior space of the sealed enclosure, the battery being electrically coupled to a first conductor element of the first connector; and a second connector, the second connector adapted to be removably connected to the first connector, the second connector comprising a plurality of conductor elements corresponding to the plurality of conductor elements of the first connector such that each conductor element of the plurality of conductor elements of the first connector is conductively coupled to a corresponding conductor element of the plurality of conductor elements of the second connector when the first connector and the second connector are connected together; and a sensor coupled to the second connector such that at least one of the plurality of conductor elements of the second connector receives a signal from the sensor;

wherein when the first connector and the second connector are connected together, an electrical power is applied from the battery to a first conductor element of the first connector, and is further routed through a corresponding first conductor element of the second connector that is coupled to a second conductor element of the second connector such that the electrical power is applied to a second conductor element of the first connector corresponding to the second conductor element of the second connector, and wherein the electrical power is also applied to the electrical component;

wherein when the first connector and the second connector are not connected together, the electrical power is not applied to the electrical component;

wherein when the first connector and the second connector are connected together, the signal is supplied to the electrical component via a conductive element of the first connector; and wherein at least one of the plurality of conductor elements of the first connector is used to identify a type of sensor that provides a signal to the electrical component via the second connector and the first connector.

* * * * *